US005194953A

United States Patent [19]

Chan et al.

[11] Patent Number: 5,194,953

[45] Date of Patent: Mar. 16, 1993

[54] SEGMENTED BAR DISPLAY FOR A PROGRAMMABLE TUNER

[75] Inventors: Choon M. Chan, Singapore, Singapore; Jean C. Favreau, Tannheim, Fed. Rep. of Germany; Doo L. Tay, Singapore, Singapore

[73] Assignee: Thomson Consumer Electronics, S.A., Courbevoie, France

[21] Appl. No.: 577,168

[22] Filed: Sep. 4, 1990

[30] Foreign Application Priority Data

Dec. 18, 1989 [GB] United Kingdom ................ 8928539

[51] Int. Cl.[5] ................ H04N 5/50

[52] U.S. Cl. ................ 358/192.1; 358/191.1; 455/154.1; 455/180.1

[58] Field of Search ................ 358/191.1, 192.1, 193.1; 455/154, 180

[56] References Cited

U.S. PATENT DOCUMENTS

| | | | |
|---|---|---|---|
| 3,003,029 | 10/1961 | Tults et al. | 358/192.1 |
| 4,040,719 | 8/1977 | Schiebelhuth | 350/160 |
| 4,131,853 | 12/1978 | Dreiske | 325/464 |
| 4,214,273 | 7/1980 | Brown | 358/192.1 |
| 4,366,502 | 12/1982 | Shiu | 358/193.1 |
| 4,387,401 | 6/1983 | Henderson et al. | 358/193.1 |
| 4,410,913 | 10/1983 | Chin et al. | 358/192.1 |
| 4,536,797 | 8/1985 | Maturo et al. | 358/192.1 |
| 4,549,218 | 10/1985 | Norley et al. | 358/192.1 |
| 4,598,317 | 7/1986 | Yu | 358/192.1 |
| 4,605,968 | 8/1986 | Hayashi | 358/192.1 |
| 4,649,429 | 3/1987 | Park | 358/192.1 |
| 4,835,613 | 5/1989 | Johnson | 358/22 |
| 4,935,814 | 6/1990 | Omoto et al. | 358/192.1 |
| 5,006,933 | 4/1991 | Suzuki et al. | 358/192.1 |
| 5,103,313 | 4/1992 | Chan et al. | 358/193.1 |

FOREIGN PATENT DOCUMENTS

| | | | |
|---|---|---|---|
| 0186205 | 7/1986 | European Pat. Off. . | |
| 0357398 | 3/1990 | European Pat. Off. . | |
| 2432600 | 1/1970 | Fed. Rep. of Germany . | |
| 0250727 | 12/1985 | Japan | 358/192.1 |

OTHER PUBLICATIONS

Sony Trinitron Colour TV KV-25XSD, KV-25XSTD Operating Instructions, 1987 pp. 1-6.

*Primary Examiner*—John K. Peng
*Assistant Examiner*—Jeffrey S. Murrell
*Attorney, Agent, or Firm*—Joseph S. Tripoli; Peter M. Emanuel; Thomas F. Lenihan

[57] ABSTRACT

A low cost tuning bar type display for a television tuner is utilized for providing programming position information by segmenting the tuning bar into a predetermined number of dots, each of which corresponds to a programming position. A selected programming position is indicated by elongating the appropriate dot of the display.

2 Claims, 9 Drawing Sheets

200
ENTER
205
LINE < 24 ?
YES
NO
206
LINE = 24 ?
YES
NO
210
LINE < 256 ?
YES
NO
211
LINE = 32 ?
YES
NO

220
LINE = 36 ?
YES
NO
235
BAND = 1 ?
YES
NO
240
LINE = 44 ?
YES
NO
250
LINE = 48 ?
YES
260
LINE = 56 ?
YES
NO
270
LINE = 60 ?
YES
NO
280
BAND = 111 ?
YES
NO
290
LINE = 68 ?
YES
NO
298
LINE = 72 ?
YES
NO
270
BAR OFF
230
EXIT TO REMAINDER OF PROGRAM
225
BAR ON

SEGMENTED BAR DISPLAY FOR A PROGRAMMABLE TUNER

CLAIM OF PRIORITY

The subject patent application claims priority, under 35 U.S.C. 119, from British Section 15 (1) application Ser. No. 8928539.9, which was filed Dec. 18, 1989.

CROSS REFERENCE TO A RELATED APPLICATION

A patent application bearing application Ser. No. 07/576,920, filed herewith, and assigned to the same assignee as the subject application, contains related subject matter.

FIELD OF THE INVENTION

The subject invention relates to the field of tuning systems for television receivers.

BACKGROUND OF THE INVENTION

The term television receiver as used herein includes television receivers having a display device (commonly known as television sets) and television receivers without a display device, such as videocassette recorders (VCR's). Many modern television receivers include circuitry for generating an on-screen indication useful for tuning the television receiver to selected channels.

In medium-priced and higher-priced television receivers, the inclusion of an alphanumeric on-screen display (OSD) generator circuit for providing an on-screen display of programming information such as channel number is quite common. However, in lower-priced television receivers, the use of a separate OSD circuit is generally not cost-effective.

It is known in lower-cost television receivers to use a vertical tuning bar to display tuning information. In such a system the relative horizontal portion of the vertical tuning bar is indicative of channel number. The horizontal displacement of the tuning bar is generally a function of magnitude of the tuning voltage required to tune each channel. Band information (VHF-low, VHF-high, UHF in the United States or Bands I, II, III and UHF in Europe) is usually indicated by the color of the tuning bar. Such a system as described thus far is known from U.S. Pat. No. 4,410,913 (Chin et al.) issued Oct. 18, 1983.

The lowest-priced television receivers of all tend to be monochrome portable television receivers. Such receivers need an inexpensive and non-complex arrangement for producing a display of programming positions. Such receivers would also benefit from the use of the low-cost tuning bar display of Chin et al. but clearly cannot use the color of the tuning bar as a tuning band indication.

SUMMARY OF THE INVENTION

It is herein recognized that a segmented vertical bar displayed on a display screen may be used to indicate a plurality of tuner programming positions.

It is further recognized that a selected one of the programming positions may be indicated by displaying a single illuminated portion of a second vertical bar adjacent to an interrupted vertical bar indicative of programming positions.

It is further herein recognized that the circuitry for generating the segmented vertical bar for the display of operation for generating a segmented vertical tuning bar comprising a relatively large portion and one or more smaller portions, wherein the number of smaller portions being displayed is indicative of the tuning band in which tuning is to take place.

DETAILED DESCRIPTION OF THE DRAWING

Figure 1:
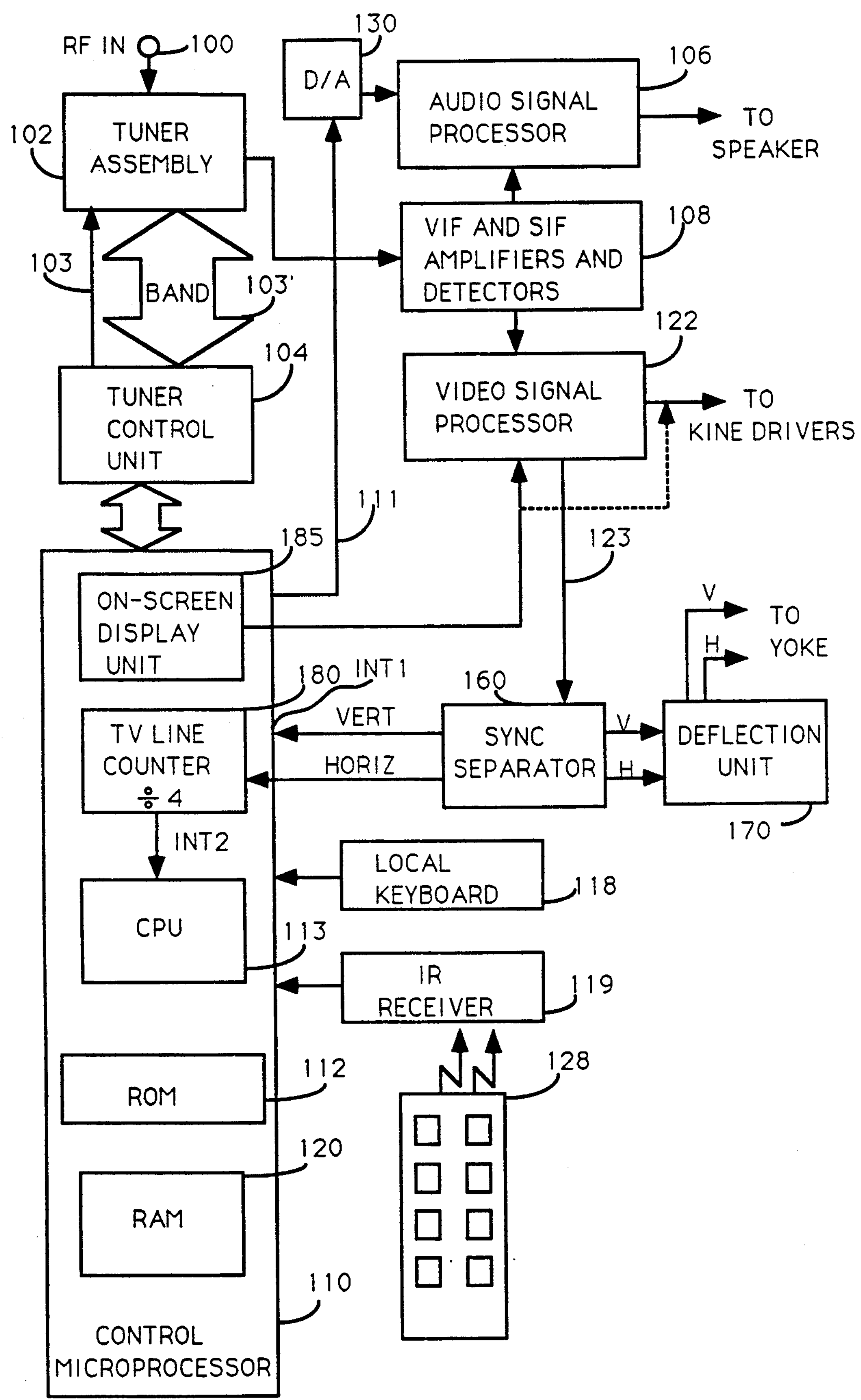
FIG. 1 illustrates in block diagram form portions of a television receiver suitable for use with the invention.

Referring to FIG. 1, a television receiver includes an RF input terminal 100 which receives radio frequency (RF) signals and applies them to a tuner assembly 102. Tuner assembly 102 selects and amplifies a particular RF signal under control of a tuner controller 104 which provides a tuning voltage via a wire 103, and bandswitching signals via signal lines represented by the broad double-ended arrow 103', to tuner assembly 102.

Tuner assembly 102 converts the received RF signal to an intermediate frequency (IF) signal and provides an IF output signal to video (VIF) and sound (SIF) amplifier and detector unit 108. VIF/SIF amplifier and detector unit 108 amplifies the IF signal applied to its input terminal and detects the video and audio information contained therein. The detected video information is applied as one input of a video processor unit 122. The detected audio signal is applied to an audio processor 106 for processing and amplification before being applied to a speaker (not shown).

Tuner controller 104 (which may be within control microcomputer 110) generates the tuning voltage and bandswitching signals in response to control signals applied from a system control microcomputer (μC) 110. The terms "microcomputer", controller, and "microprocessor", as used herein, are equivalent. It is also recognized that the control function of microcomputer 110 may be performed by an integrated circuit especially manufactured for that specific purpose (i.e., a "custom chip"), and the term "controller", as used herein, is also intended to include such a device. Microcomputer 110 receives user-initiated commands from an infrared (IR) receiver 119 and from a "local" keyboard 118 mounted on the television receiver itself. IR receiver 119 receives IR transmissions from remote control transmitter 128. Microcomputer 110 includes program memory (ROM) 112, and stores channel-related data in a random-access memory (RAM) 120. RAM 120 may be either internal to, or external to, microprocessor 110, and may be of either the volatile or non-volatile type. The term "RAM" is also intended to include electrically-erasable programmable read only memory (EEPROM). One skilled in the art will recognize that if volatile memory is utilized, that it may be desirable to use a suitable form of standby power to preserve its contents when the receiver is turned off.

Video signal processor 122 supplies a composite video signal to a sync separator unit 160 which produces vertical (V) and horizontal (H) synchronizing signals at respective outputs. The horizontal and vertical synchronizing signals are applied to a horizontal and vertical deflection unit 170 for generating scanning control signals for application to the yoke windings of a picture tube assembly (not shown).

The separated horizontal and vertical synchronizing signals (sync signals) are also applied to respective inputs f controller 110. Controller 110 (which may be a Toshiba TMP47C237 microprocessor) includes a TV line counter unit 180 which is initialized by the vertical sync signal (INT1) interrupt service routines (as shown in FIG. *2a*) and clocked by the horizontal sync signal. TV line control processing unit (CPU) portion of controller 110 at the end of every fourth horizontal line.

Controller 110 also includes an on-screen display unit 185. On-screen display unit 185 has an output coupled to a second input of video signal processor 122, or the kine driver circuitry (not shown), for generating and displaying a vertical bar on the display screen. When enabled, on-screen display unit 185 causes the display of a uniform area of brightness along successive horizontal scanning lines for a period of approximately 2 microseconds (2 μs.). The effect produced on a display screen is that of a vertical bar having a width of approximately one-thirtieth (1/30) of the width of the display screen (i.e., 2/60 μs, where 60 μs. is the approximate period of the viewable portion of a horizontal line in NTSC).

On-screen display unit 180 includes circuitry for generating a high frequency dot clock. The dot clock is phase-locked to the incoming horizontal sync signal when the tuner is tuned to an active TV channel, or free running at a multiple of the nominal horizontal sync frequency when the tuner is not tuned to an active TV channel. The dot clock defines the positions in which the vertical bar may be displayed. In this case, the maximum number of possible display positions which are viewable on the screen is 256. Thus, a vertical bar may be displayed at a specific point on the display screen by specifying a number in the range from 0–255, and applying that number to the on-screen display unit to specify the horizontal start position of the bar.

Controller 110 is programmed to use the four-line interrupt signal provided by TV LINE COUNTER unit 180 to alternately turn-on and turn-off the display of the vertical bar. Alternately turning-on and turning-off the display of the vertical bar a given number of times produces the display of a segmented vertical bar, as shown in FIGS. 3, 4, 5 and 6.

Figure 7:
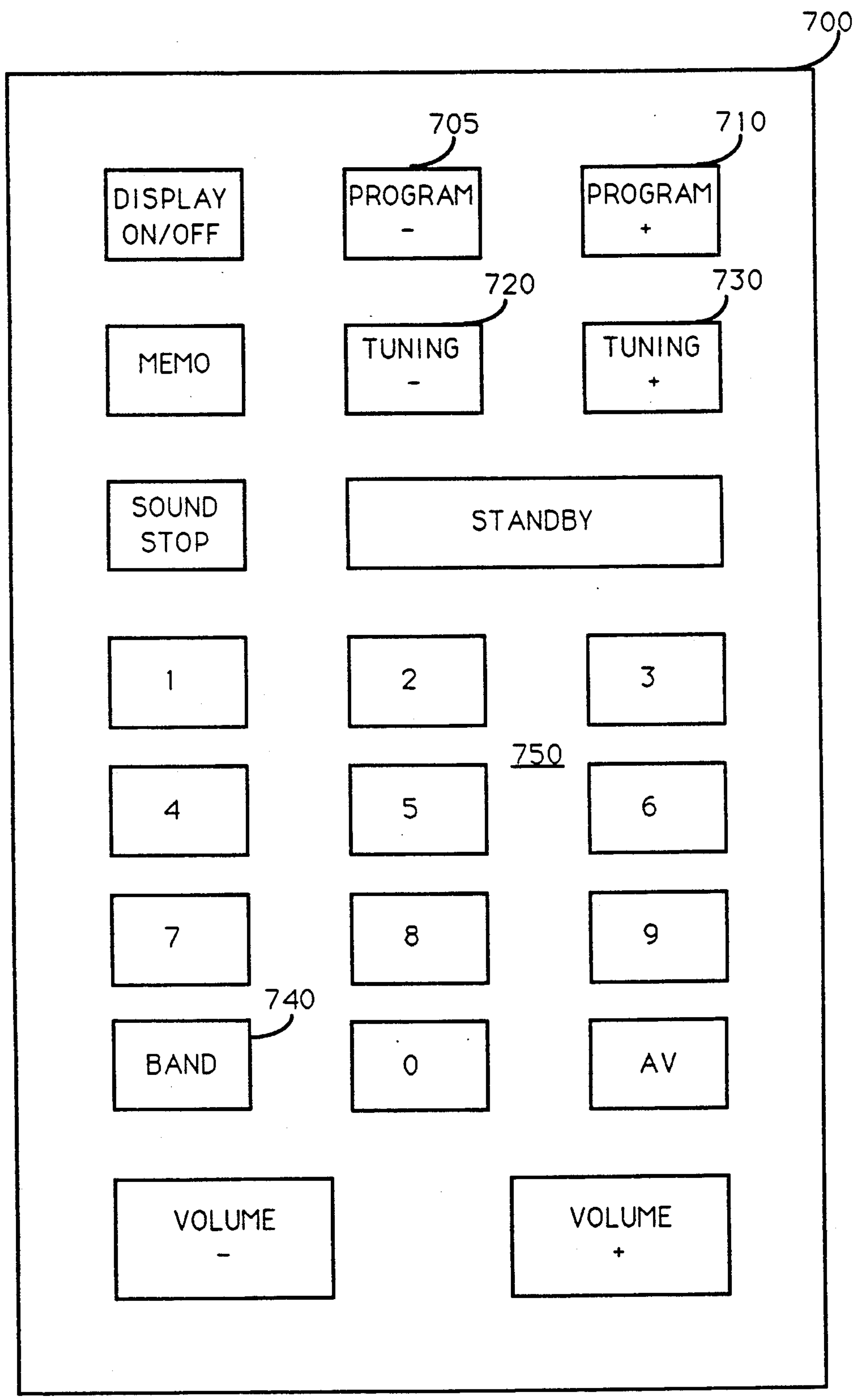
FIG. 7 is an detailed view of the keyboard of the remote control unit of FIG. 1.

FIG. 7 shows a detailed view of a keyboard 700 of remote control unit 128 of FIG. 1. Remote control unit keyboard 700 of FIG. 7 includes, among other keys, a PROGRAM− key 705, a PROGRAM+ key 710, a TUNING− key 720, a TUNING+ key 730, a BAND key 740, and digit keys 0–9 generally designated 750.

Figure 3:
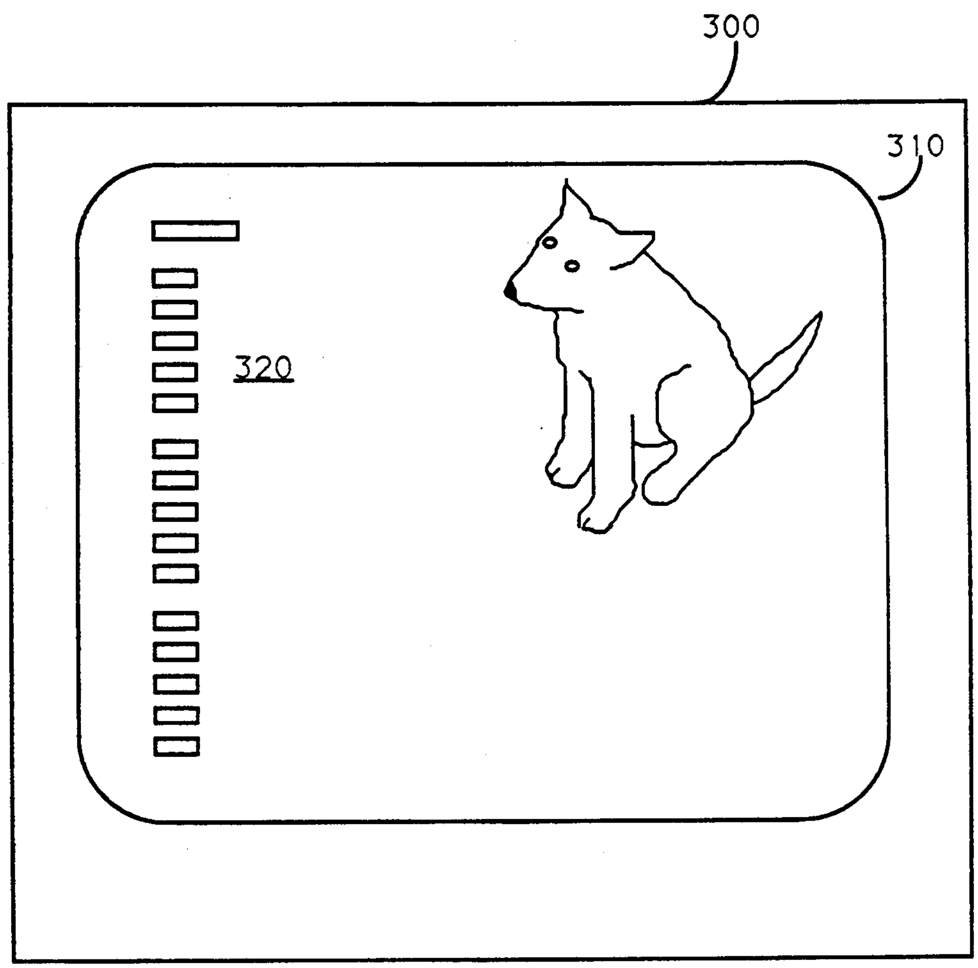
FIGS. 3, 4, 5, and 6 are illustrations of display screens showing displays in accordance with aspects of the invention.

The television receiver of FIG. 1 provides 16 programming positions each of which may be programmed with data relating to a particular television channel. A viewer may directly access the individual program positions by use of the remote control unit. Programs 1 to 9 are selected by pressing keys 1–9 respectively. Program 10 is selected by pressing key 0. When a program is selected, the on-screen display (OSD) is enabled for approximately 3 seconds to produce a display such as shown in FIG. 3. The display 320 of FIG. 3, displayed on a display screen 310 of a television receiver 300, may be caused to blink during that period. To select programs 11 to 16, the viewer presses key 1 which causes the selection of program 1, accompanied by the blinking display described above. While the OSD display is blinking, if the viewer enters another digit, in the range from 1–6 then a program between 11 and 16 will be selected. The display of FIG. 3 shows the selection of program 16 by the elongation of the uppermost eight-line dot of the display. In this example, the programs are numbered from the bottom, beginning with 1 and ending at the top with 16. Program 16 may be reserved for an audiovisual input from a VCR.

Figure 2:
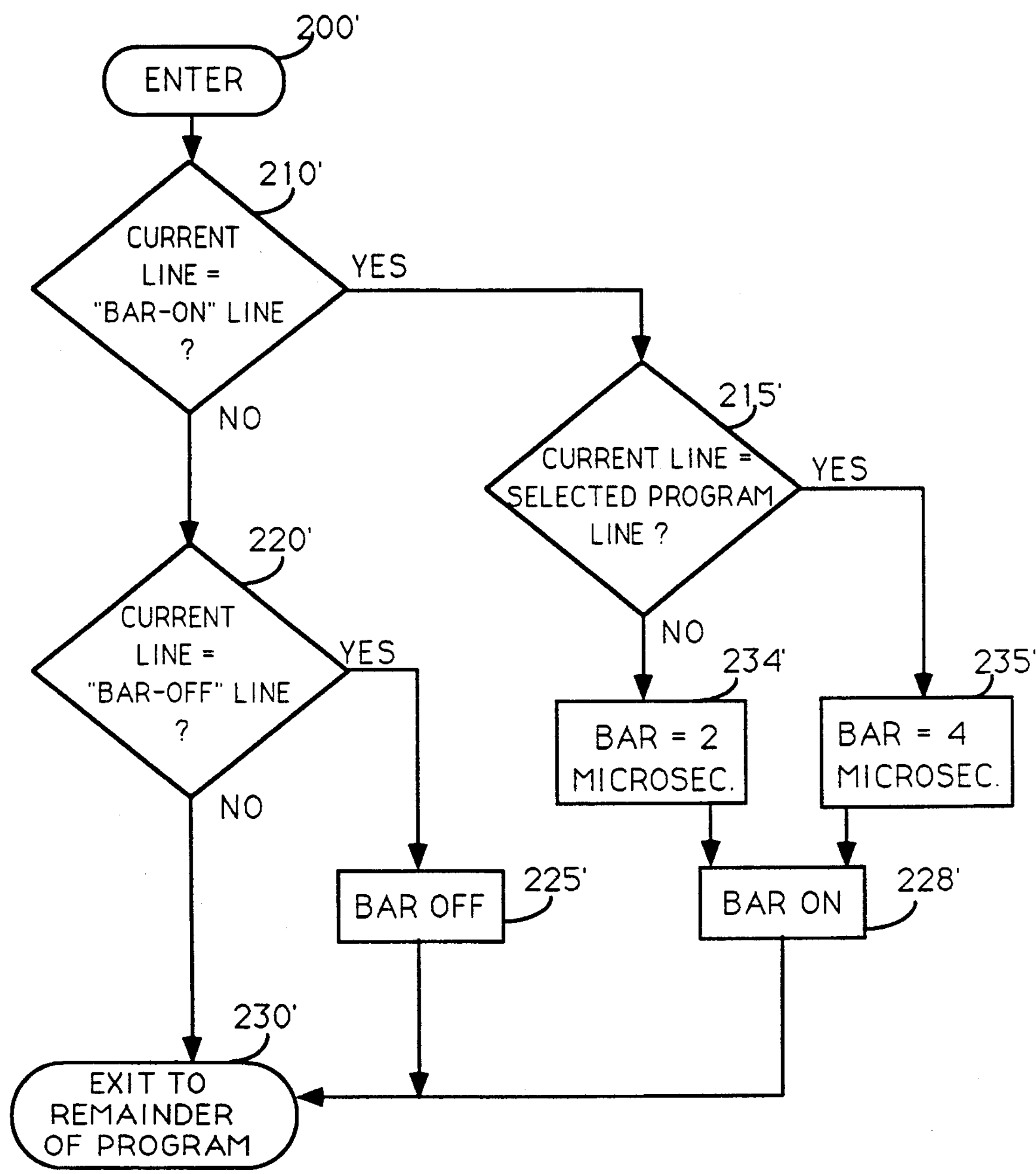
FIGS. 2, 2*a*, and 2*b* are flowcharts showing portions of the control program suitable for use with the microprocessor of FIG. 1.
Figure 2A:
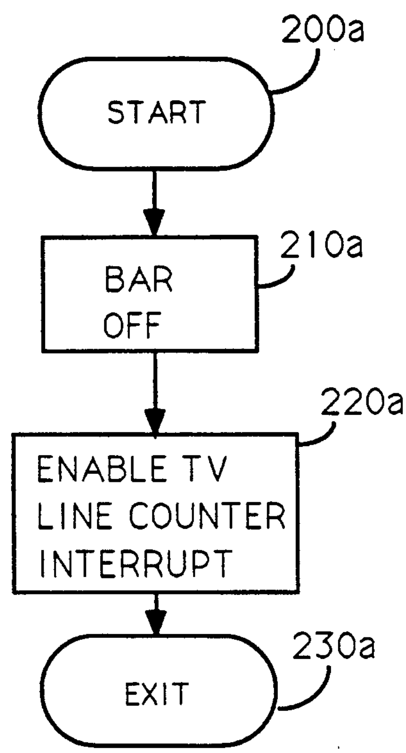

Referring to FIG. 3 the vertically oriented array of dots (i.e., a plurality of vertically aligned illuminated areas) is formed by segmenting a 2 μs-wide bar display by turning the bar on and off at appropriate lines. The elongated portion is generated by extending the time period in which the display is enabled for an additional 2 μs. A simplified flowchart for this operation is shown in FIG. 2. Each dot is eight lines high, and is separated from other dots by spaces of either four or eight lines. Separating groups of five programming-position dots by eight-line spaces provides for easier reading of the display.

For the flowchart of FIG. 2, the "BAR-ON" lines are TV lines 24, 40, 52, 64, 76, 88, 104, 116, 128, 140, 152, 168, 180, 192, 204, and 216. The "BAR-OFF" lines are 32, 48, 60, 72, 84, 96, 112, 124, 136, 148, 160, 176, 188, 200, 212, and 224. These line numbers may be stored in a "look-up" table and used in comparison steps 210′ and 220′ respectively. The routine illustrated in the flowchart of FIG. 2 is entered at step 200′. If the current line is a BAR-ON line then a check is made to see if the current line is representative of the selected program. As noted above, each of the dots of the display corresponds to a programming position. Step 215′ compares the currently selected position with the current TV line position. If the current line is the starting line of the dot which corresponds to the currently selected programming position, then a command is issued to the on-screen display unit to turn on the dot for 4 μs. (step 235′). If nit, then a command is issued to the on-screen display unit to turn on the dot for only 2 μs. (step 240′). If, at step 210′, it was determined that the current line is not a "BAR-ON" line, then a check is made at step 220′ to see if the current line is a "BAR-OFF" line. If so, the bar is turned off (step 225′). If not, then the routine is exited.

The tuning mode is entered by pressing Band key 740. In response, the OSD causes the display of a tuning bar at a position on the screen which is indicative of the magnitude of the currently generated tuning voltage. A relatively low tuning voltage causes the tuning bar to be displayed on the left side of the display screen. Increasing the tuning voltage causes the tuning bar to be repositioned toward the right side of the display screen. Increasing and decreasing the magnitude of the tuning voltage is accomplished by pressing TUNING+ key 730, and TUNING− key 720, respectively.

Figure 4:
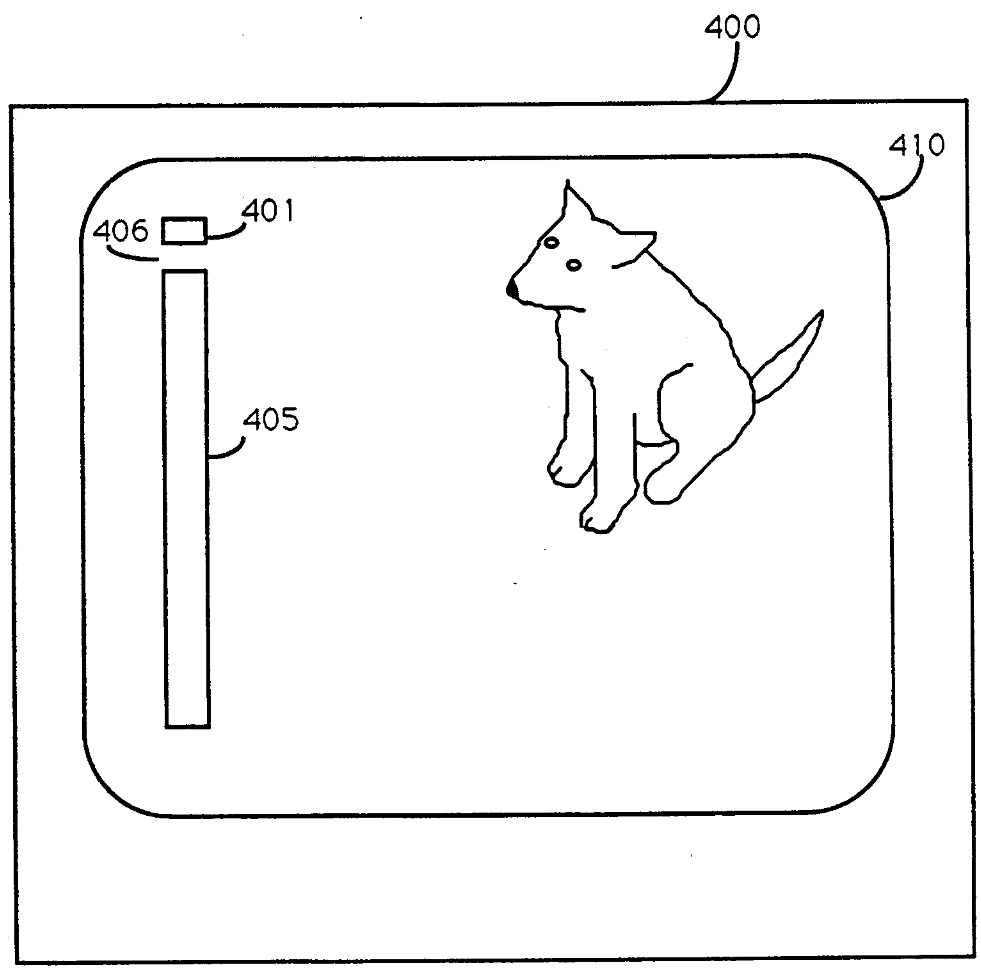
Figure 5:
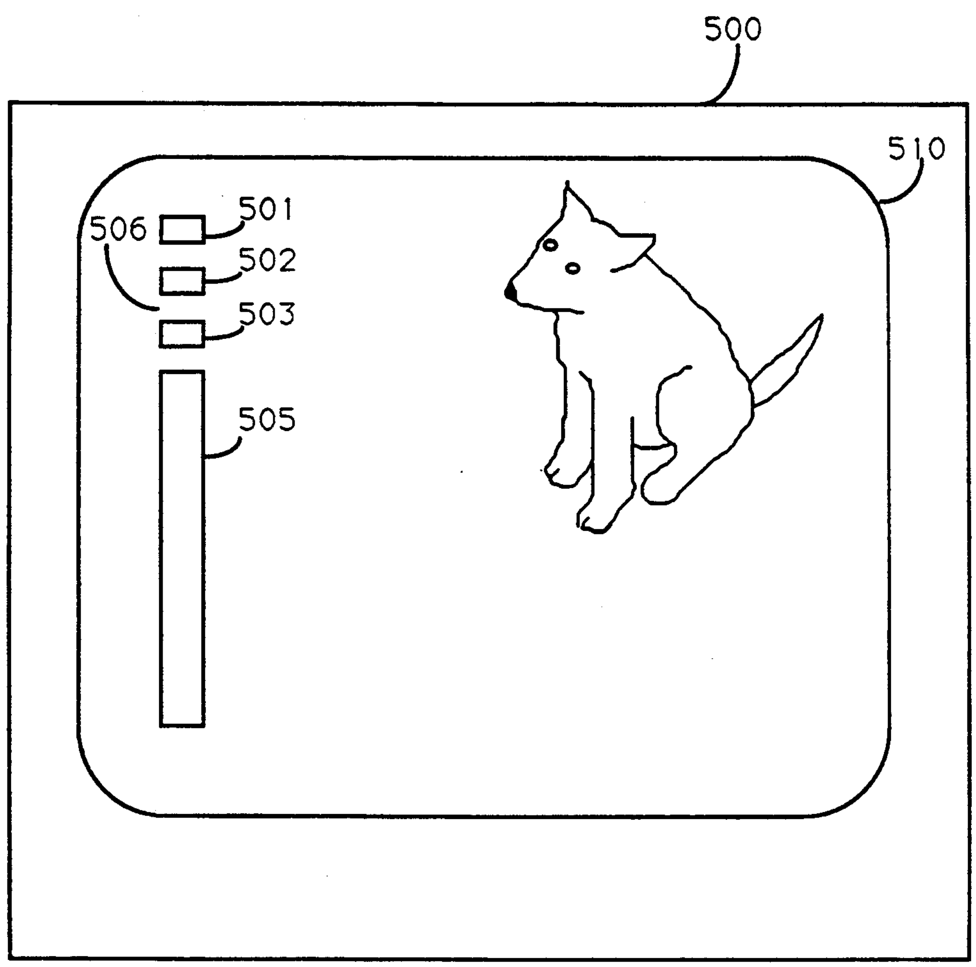
Figure 6:
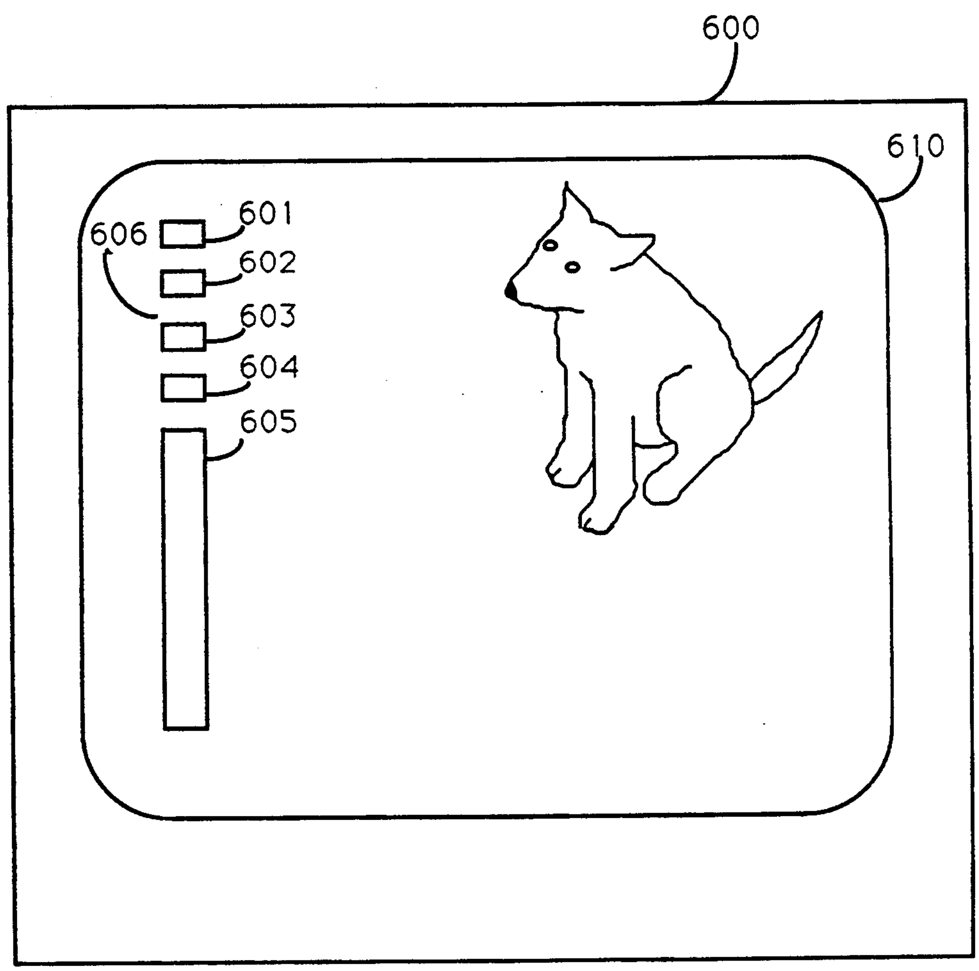

Band information is displayed by segmenting the tuning bar, as shown in FIGS. 4, 5, and 6. FIG. 4 shows a television receiver 400, having a display screen 410. A tuning bar display for VHF Band I is shown at the left side of the screen. VHF Band I is indicated by segmenting the tuning bar into a single small area (or dot) 401 separated from the main tuning bar 405 by a single space 406. In FIGS. 5, and 6, similarly numbered elements serve the same purpose as those in FIG. 4 and need not be described again. FIG. 5 shows the display for VHF Band III comprising three dots 501–503 separated from each other and from main tuning bar 505 by spaces 506. Similarly, FIG. 6 shows the display for the UHF Band comprising four dots 601–604 separated from each other and from main tuning bar 605 by spaces 606.

Note that the length of the tuning bar stays constant within a given band. Only its position changes in response to changes in tuning voltage, as opposed to known systems in which the length of the tuning bar varies with the tuning voltage. Thus, under snowy, weak, or no signal conditions, the constant-length tuning bar is more clearly visible than a variable length tuning bar which may grow so short as to be lost in the snow on the display screen.

The band-indicative dots described above are really part of the tuning bar. They are formed by blanking a portions of the tuning bar. Thus, the band-indicative dots move left and right along with the main tuning bar in response to a change in the tuning voltage.

Figure 2B:
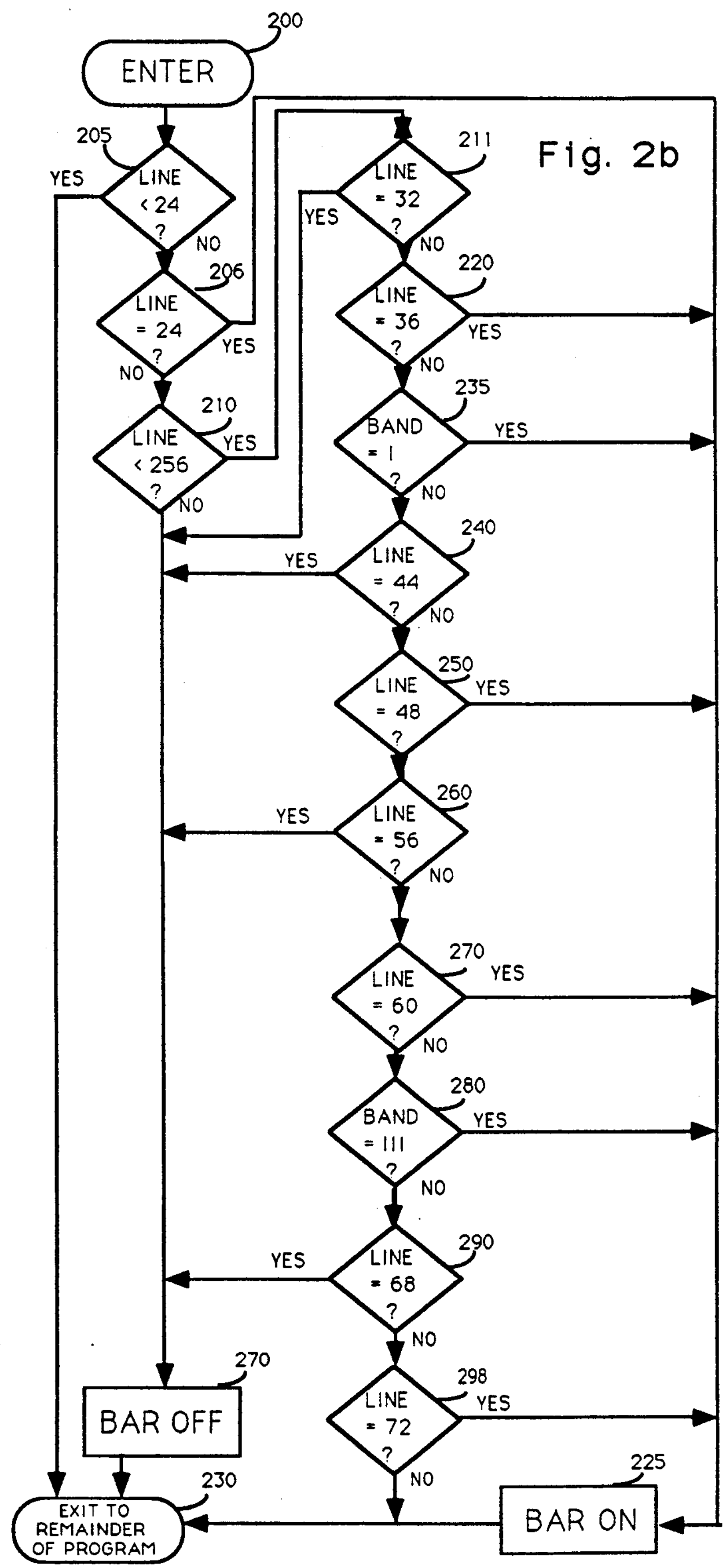

The flowchart of FIG. 2*b* illustrates a portion of the control program executed by microcomputer 110 upon receipt of the above-mentioned four-line interrupt signal generated by TV LINE COUNTER unit 180. The routine is entered at step 200. At step 205, the current TV line number is read to determine if the scan is in the viewing area of the screen. Typically, TV lines 1–17 are in the vertical blanking area at the top of the screen. Therefore, line 20 is the first viewable line at which a four-line interrupt occurs. It is felt that a more pleasing display is generated if the top of the bar begins at line 24. Accordingly, if the current line number is less than 24, then the routine is exited at step 230. If the current line number is greater than 256 (step 210), then the current line is near the bottom of the viewable area of the screen, and the bar may be turned-off (step 270).

If the current line number is 24, then the bar is turned on (step 206). TV line 24 is the start of the first eight-line dot. If the current line number is between 24 and 256, regardless of which band is being tuned, the current line is checked to see if it is line 32 (steps 211). The bar is turned off at line 32. TV line 32 is the start of the space separating the first eight-line dot from the remaining dots or the main tuning bar. If the current line is not 32, then the current line is checked to see if it is 36 (step 220). If so, then the bar is again turned on. If the current line is not 36, then a check is made to see if Band I is currently being tuned. If Band I is currently being tuned, then the bar is turned on (step 225), and the program is exited. If Band I is not currently being tuned, then checks are made (step 240 and 260) to see if the current line number is either 44 or 56 (i.e., the starting points of the next spaces separating the band-indicative dots). If so, then the bar is again turned off (step 270). If not, a check is made to see if Band III is currently being tuned (step 280). If Band III is being tuned then no more spaces are necessary in the tuning bar, and the bar is then turned on (step 225). If Band III is not being tuned, it is assumed that the UHF band of frequencies is being tuned. A check is made at step 290 to determine if the current line is line 68. If so, then the bar is turned off. If not, then another check is made at step 298 to turn the bar on again at line number 72.

In the above-described manner, the bar is turned on at all lines other than those which occur in the appropriate number of spaces to indicate each respective band.

As noted above, the subject invention is particularly useful for producing programming and tuning displays for black and white (monochrome) television receivers. However, it is herein recognized that the subject apparatus may be a cost effective solution to the problem of providing programming information displays for low cost color television receivers as well.

The subject invention is also felt to be particularly useful when incorporated within a videocassette recorder (VCR) because it ensures that programming and tuning information are conveyed to a user even when the output signal of the VCR is coupled to a monochrome television receiver.

What is claimed is:

1. A tuning system for a television receiver, comprising:

tuning means for selecting a particular RF signal from a plurality of RF signals;

control means including programming means coupled to said tuning means for storing tuning data corresponding to selected ones of said plurality of RF signals, said tuning data being associated with respective programming positions;

said control means also including on-screen display generation means for generating a video signal corresponding to a plurality of vertical aligned illuminated areas, said illuminated areas being separated by a space;

wherein, each of said illuminated areas is indicative of one of said respective programming positions of said programming means, and a selected programming position is indicated by the illumination of a second area adjacent to only one of said plurality of vertically aligned illuminated areas.

2. The tuning system of claim 1, wherein said television receiver is a videocassette recorder unit having an output terminal at which said video signals for display are produced, and wherein a display means is coupled to said output terminal for receiving said video signals and displaying images in response thereto.

* * * * *